US012810228B2

(12) United States Patent
Cler et al.

(10) Patent No.: US 12,810,228 B2
(45) Date of Patent: Nov. 24, 2026

(54) BATTERY-POWERED WORK MACHINE DOWNTIME ANALYSIS

(71) Applicant: Caterpillar Inc., Peoria, IL (US)

(72) Inventors: Eric Wade Cler, Oswego, IL (US); Adam Gavin Kramer, Chicago, IL (US); Joshua L. Freeman, Naperville, IL (US)

(73) Assignee: Caterpillar Inc., Peoria, IL (US)

( * ) Notice: Subject to any disclaimer, the term of this patent is extended or adjusted under 35 U.S.C. 154(b) by 53 days.

(21) Appl. No.: 18/908,660

(22) Filed: Oct. 7, 2024

(65) Prior Publication Data

US 2026/0099797 A1 Apr. 9, 2026

(51) Int. Cl.
*G06Q 10/0637* (2023.01)
*G01R 31/382* (2019.01)

(52) U.S. Cl.
CPC ..... *G06Q 10/06375* (2013.01); *G01R 31/382* (2019.01)

(58) Field of Classification Search
None
See application file for complete search history.

(56) References Cited

U.S. PATENT DOCUMENTS 9,157,383 B2 10/2015 Stevens et al.
2020/0026317 A1 1/2020 Boyer
2020/0254899 A1 8/2020 Uchida et al.
2023/0011148 A1 1/2023 Jeong et al.
2023/0062034 A1 3/2023 Kobayashi et al.
2023/0322202 A1* 10/2023 Clark .................. A01D 41/127 701/22
2023/0382265 A1 11/2023 Marks et al.
2023/0419208 A1* 12/2023 Wulf ..................... E02F 9/2091
2024/0079895 A1* 3/2024 Juneja ....................... H02J 7/92
2024/0221103 A1* 7/2024 Ward ..................... G06Q 50/40

FOREIGN PATENT DOCUMENTS

WO 2023189368 A1 10/2023

* cited by examiner

*Primary Examiner* — Chesiree A Walton

(57) ABSTRACT

In some implementations, a computing device may receive machine information and operating parameters associated with a battery-powered work machine. The computing device may estimate utilization of the battery-powered work machine based, at least in part, on a workday simulation using the machine information and the operating parameters. The computing device may determine a disruption score that indicates a predicted impact of replacing a diesel-powered work machine with the battery-powered work machine, wherein the disruption score is based, at least in part, on a predicted charging downtime of the battery-powered work machine. The computing device may display, using a user interface of the computing device, a recommendation associated with replacing the diesel-powered work machine with the battery-powered work machine, wherein the recommendation is based, at least in part, on the disruption score.

20 Claims, 4 Drawing Sheets

BATTERY-POWERED WORK MACHINE DOWNTIME ANALYSIS

TECHNICAL FIELD

The present disclosure relates generally to analyzing machines at a worksite and, for example, to performing a downtime analysis associated with using one or more battery-powered machines at a worksite.

BACKGROUND

Work machines at a construction site are typically powered by diesel fuel. Replacing diesel-powered work machines with battery-powered work machines may provide some advantages. For example, battery-powered work machines may reduce an environmental impact. Additionally, battery-powered work machines may have a lower operating cost, particularly if the cost to charge a battery is lower than the price of diesel fuel. Further, the cost to operate a battery-powered work machine may be more predictable than the cost to operate a diesel-powered work machine since the cost of electricity does not fluctuate as much as the cost of diesel fuel.

Despite the benefits of battery-powered work machines over diesel-powered work machines, not all construction sites can accommodate battery-powered work machines. Also, a construction site manager may not know how to plan a construction project using battery-powered work machines. Accordingly, a construction site manager may delay replacing one or more diesel-powered work machines with a suitable battery-powered work machine even if the battery-powered work machines would lower the cost and expedite the completion of the construction project.

The computing device and method of the present disclosure solve one or more of the problems set forth above and/or other problems in the art.

SUMMARY

A method may include receiving, by a computing device, machine information and operating parameters associated with a battery-powered work machine; estimating, by the computing device, utilization of the battery-powered work machine based, at least in part, on a workday simulation using the machine information and the operating parameters; determining, by the computing device, a disruption score that indicates a predicted impact of replacing a diesel-powered work machine with the battery-powered work machine, wherein the disruption score is based, at least in part, on a predicted charging downtime of the battery-powered work machine; and displaying, using a user interface of the computing device, a recommendation associated with replacing the diesel-powered work machine with the battery-powered work machine, wherein the recommendation is based, at least in part, on the disruption score.

A computing device may include a user interface having a display screen; one or more memories; and one or more processors, communicatively coupled to the one or more memories, configured to: receive machine information and operating parameters associated with a battery-powered work machine; estimate utilization of the battery-powered work machine based, at least in part, on a workday simulation using the machine information and the operating parameters; determine a disruption score indicating a predicted impact of replacing a diesel-powered work machine with the battery-powered work machine, wherein the disruption score is based, at least in part, on a predicted charging downtime of the battery-powered work machine; and output, to the display screen, a recommendation associated with replacing the diesel-powered work machine with the battery-powered work machine, wherein the recommendation is based, at least in part, on the disruption score.

A computing device may include a user interface having a display screen; one or more memories; and one or more processors, communicatively coupled to the one or more memories, configured to: receive machine information and operating parameters associated with one or more battery-powered work machines; estimate utilization of the one or more battery-powered work machines based, at least in part, on a workday simulation using the machine information and the operating parameters; determine a charger load based, at least in part, on the workday simulation and utilization of the one or more battery-powered work machines, wherein the charger load is based, at least in part, on a predicted charging time of each of the one or more battery-powered work machines; and output, to the display screen, a recommendation associated with the one or more battery-powered work machines, wherein the recommendation is based, at least in part, on the charger load.

DETAILED DESCRIPTION

This disclosure relates to analyzing a disruption associated with replacing, at a construction site, one or more diesel-powered work machines with one or more battery-powered work machines.

Figure 1:
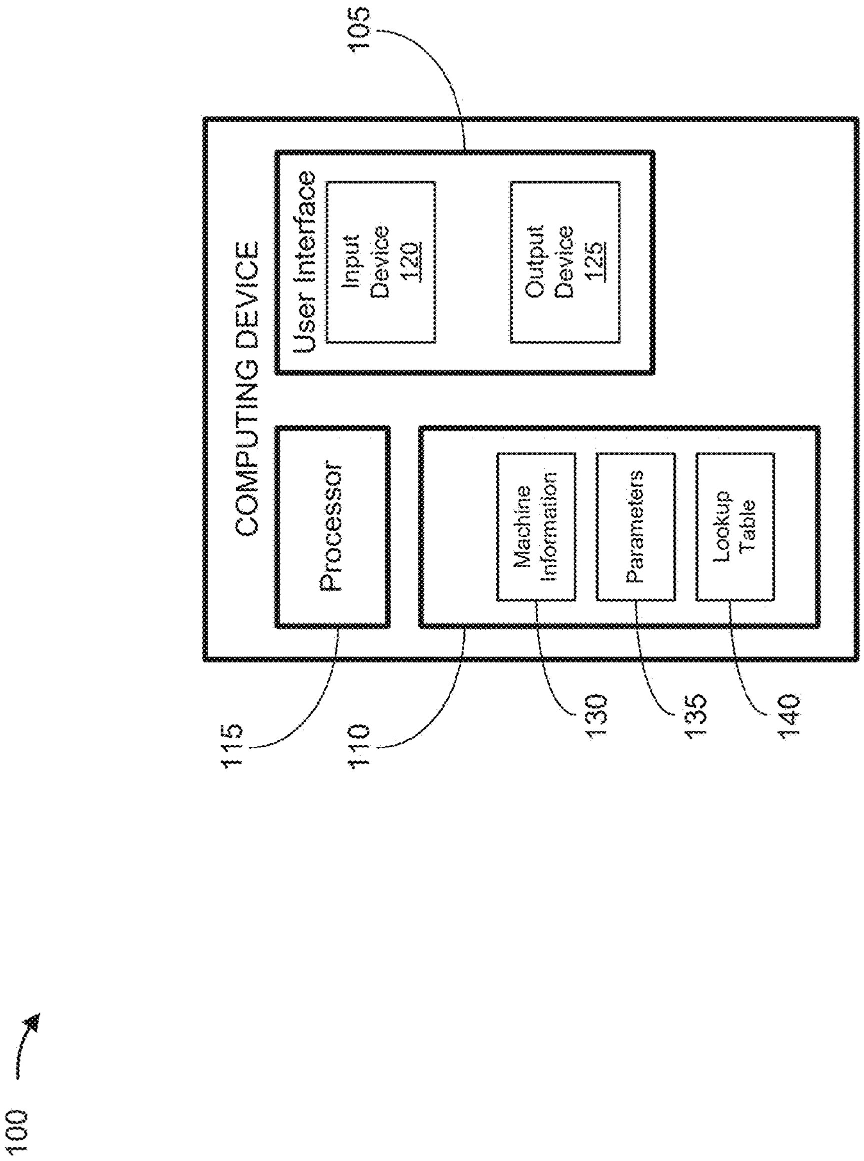
FIG. 1 is a diagram of an example computing device associated with analyzing a downtime associated with a battery-powered work machine.

FIG. 1 is a diagram of an example computing device 100 associated with analyzing a downtime associated with a battery-powered work machine. The computing device may be a laptop computer, a tablet computer, or a smartphone, among other examples. For example, the computing device may be used to analyze the downtime associated with replacing one or more diesel-powered work machines with one or more battery-powered work machines. Examples of diesel-powered work machines that may be replaced by battery-powered work machines may include excavators, bulldozers, dump trucks, cranes, backhoes, tractors, forklifts, skid steer loaders, generators, forestry equipment, and/or a combination thereof, among other examples.

The computing device may perform the analysis relative to a particular construction project or construction site. A construction site may be a location where a construction project occurs. For construction projects using battery-powered work machines, the construction site may include one or more charging locations. Each charging location may include a power source and a charger to charge a battery of the battery-powered work machine. As shown in FIG. 1, the example computing device 100 includes a user interface 105, a memory 110, and a processor 115.

The user interface 105 may include one or more electronic components that allow a user to interact with the computing device 100. The user interface 105 may include one or more input devices 120 and/or one or more output devices 125. Examples of an input device 120 may include a keyboard, a mouse, a touch-sensitive surface, a microphone, and/or a combination thereof, among other examples. Examples of an output device 125 may include one or more of a display, speakers, and/or a combination thereof, among other examples. The user interface 105 may further include software components that may interpret the user input and generate corresponding output. The software components may include a graphical user interface element, a command-line interface element, or any other type of interface component that facilitates communication between the user and the computing device 100. The user interface 105 may also include a processing unit that may be configured to execute instructions associated with the user interface 105 and manage data exchange between the input device 120, the output device 125, and the software components.

The memory 110 may include one or more physical storage mediums configured to store data, instructions, or other information. The memory 110 may be volatile or non-volatile. The memory 110 may include random access memory, read-only memory, flash memory, or any other type of memory that may be used in a computing device 100. The memory 110 may be configured to store executable instructions that may be retrieved and executed by a processor 115 of the computing device 100. The memory 110 may be further configured to store data that may be used by one or more applications, processes, or functions of the computing device 100. The memory 110 may also include one or more memory modules or memory devices, which may be arranged in a particular configuration or architecture, such as a single in-line memory module, dual in-line memory module, and/or a combination thereof, among other examples. The memory 110 may be accessed by the processor 115 or other components of the computing device 100 through one or more memory interfaces, buses, or controllers. As discussed in greater detail below, information that may be stored in the memory 110 may include machine information 130 (e.g., information about one or more battery-powered work machines), parameters associated with an operation of one or more battery-powered work machines, one or more lookup tables, and/or a combination thereof, among other examples.

The processor 115 may include circuitry configured to execute instructions to perform operations on data. The processor 115 may include one or more processing units, such as central processing units, graphics processing units, digital signal processors, application-specific integrated circuits, or field-programmable gate arrays. Each processing unit may include one or more cores, and each core may be configured to independently execute instructions in parallel. The processor 115 may further include one or more memory controllers, cache memories, or communication interfaces, which may be configured to facilitate data access and transfer between the processor 115 and other components of a computing device 100. The processor 115 may be configured to interact with various types of memory (e.g., the memory 110), including volatile memory, non-volatile memory, or external memory, through one or more buses or other communication channels. The processor 115 may be implemented as a single integrated circuit or as a combination of multiple integrated circuits within a computing device 100.

The processor 115 may be configured to access machine information 130 and operating parameters 135 associated with a battery-powered work machine. The machine information 130 and operating parameters 135 may be stored in the memory 110, and the processor 115 may receive the machine information 130 and operating parameters 135 by accessing the memory 110. The machine information 130 may include one or more of a ground speed, a fuel rate, or position information. The operating parameters 135 may include one or more of a battery capacity, a battery health, charger information, a charge threshold, a utilization metric, or a specific fuel consumption ratio.

The processor 115 may be configured to estimate utilization of the battery-powered work machine based, at least in part, on a workday simulation using the machine information 130 and the operating parameters 135. The workday simulation may be a process performed to replicate or emulate operational conditions, tasks, or activities associated with the use of the battery-powered work machine over a workday (e.g., a period of time within a single calendar day). The workday simulation may include one or more software modules that generate scenarios that may reflect various work environments, workloads, or machine operations. The workday simulation may include input data representing parameters such as machine settings, environmental conditions, task sequences, or operator actions. The workday simulation may further include computational models used to process the input data to produce simulated outputs that may represent performance of the battery-powered work machine, task completion, or operational efficiency over the work period. The workday simulation may be based on actual usage of work machines, including battery-powered work machines, diesel-powered work machines, and/or a combination thereof, among other examples.

Estimating the utilization of the battery-powered work machine may include determining a battery discharge rate having at least a first battery state-of-charge (SoC) and a second battery SoC, comparing the first battery SoC to a first threshold, and comparing the second battery SoC to a second threshold. The battery discharge rate may be a rate at which a battery of the battery-powered work machine is consumed during operation of the battery-powered work machine. The battery discharge rate may be based, at least in part, on the machine information 130, the operating parameters 135, settings of the workday simulation, and/or a combination thereof, among other examples. The first threshold may be an SoC value (e.g., 10% SoC, 15% SoC, 20% SoC, or the like) that indicates that the battery of the battery-powered work machine needs to be charged. The first threshold may include a buffer to, for example, make sure the battery-powered machine has sufficient power to navigate to from a work site to a charging location. The second threshold may be an SoC value (e.g., 40% SoC, 60% SoC, 80% SoC, 100% SoC, or the like) that indicates that the battery is sufficiently charged for the battery-powered work machine to return to the work site and resume operation for a remainder of the workday.

The processor 115 may be configured to estimate the utilization of the battery-powered work machine by estimating a work period in accordance with a battery discharge rate. The work period may be a period of time in which the battery-powered work machine can operate. A faster battery discharge rate may indicate a shorter work period. A slower battery discharge rate may indicate a longer work period. The battery discharge rate may be based, at least in part, on one or more charging opportunities. Accordingly, the processor 115 may be configured to identify the one or more charging opportunities. To identify the one or more charging opportunities, the processor 115 may be configured to estimate an occurrence of an idle period, which may be a length of time in which the battery-powered work machine is not expected to be operated. The processor 115 may be configured to compare the length of the idle period to an opportunity charge threshold and identify the one or more charging opportunities as a result of the length of the idle period being greater than the opportunity charge threshold. The opportunity charge threshold may be a value (e.g., a length of time) associated with navigating the battery-powered work machine to the charging location, charging the battery of the battery-powered work machine to a sufficient level (e.g., the second threshold), and returning the battery-powered work machine to the work site. If the idle period is greater than the opportunity charge threshold (e.g., if the amount of time needed to charge the battery of the battery-powered work machine and return the battery-powered work machine to the work site) is greater than the idle period (e.g., a period of time in which the battery-powered work machine will not be in use), the processor 115 may determine that the idle period is a charging opportunity. If the idle period is shorter than the opportunity charge threshold, the processor 115 may be configured to determine that the idle period is not a charging opportunity.

The processor 115 may be configured to determine a disruption score that indicates a predicted impact of replacing a diesel-powered work machine with the battery-powered work machine for a particular workday. A first disruption score may indicate that the battery-powered vehicle will not need to be charged during the workday. Accordingly, the first disruption score may be assigned to a workday simulation where a battery-powered work machine can replace a diesel-powered work machine without having any negative impact on the construction project. A second disruption score may indicate that, in accordance with the workday simulation, the battery-powered work machine will need to be charged during one or more idle periods, resulting in a minimal impact on the construction project. The impact may be considered "minimal" because the time to charge the battery of the battery-powered work machine may not extend the construction project. A third disruption score may indicate that the battery-powered work machine will be forced to undergo a force charge, which is a period of time in which the battery-powered work machine will have to be stopped for charging. Undergoing a force charge can have significant impact on the construction project because it may delay the construction project and/or extend a workday if the battery-powered work machine is used instead of a diesel-powered work machine. A fourth disruption score may indicate that the battery-powered work machine will require more than 24 hours to complete the work of a diesel-powered work machine, which will have a major impact on the construction project if the diesel-powered work machine is replaced by a battery-powered work machine.

The disruption score may be based, at least in part, on a predicted charging downtime of the battery-powered work machine. Similar to the opportunity charge threshold, the predicated charging downtime may be a length of time associated with navigating the battery-powered work machine to the charging location, charging the battery of the battery-powered work machine to a sufficient level (e.g., the second threshold), and returning the battery-powered work machine to the work site. The disruption score may be based on a driving time overhead, an energy usage overhead, and/or a charge event overhead. The driving time overhead may be a time value associated with navigating the battery-powered work machine between the charging location and the work site. Accordingly, the driving time overhead may be based, at least in part, on a machine speed and a charger distance (e.g., a distance between the battery-powered work machine and the charging location), among other examples. The energy usage overhead may be an SoC value associated with the amount of battery power used to navigate the battery-powered work machine between the charging location and the work site. Accordingly, the energy usage overhead may be based, at least in part, on a driving time (e.g., the time for the battery-powered work machine to navigate to the charging location) and an average power consumption (e.g., an average rate at which the battery-powered work machine consumes battery power). The charge event overhead may be a time value associated with initiating and ending charging of the battery of the battery-powered work machine. The charge event overhead may include an amount of time for an operator of the battery-powered work machine to exit the battery-powered work machine, insert a plug into a charging port, remove the plug from the charging port, and re-enter the battery-powered work machine, among other examples. Accordingly, the processor 115 may be configured to estimate the driving time overhead in accordance with the machine speed and the charger distance and determine the disruption score in accordance with the driving time overhead. The processor 115 may be configured to estimate the energy usage overhead in accordance with the driving time and the average power consumption, and determine the disruption score in accordance with the energy usage overhead. The processor 115 may be configured to estimate the charge event overhead in accordance with the amount of time associated with initiating and ending charging of the battery-powered work machine, and determine the disruption score in accordance with the charge event overhead.

The processor 115 may be configured to determine a charger load (e.g., a value associated with concurrent use of the charger by one or more battery-powered work machines). The processor 115 may be configured to determine the charger load in accordance with the workday simulation and utilization of one or more battery-powered work machines. The processor 115 may be configured to determine the charger load based, at least in part, on a predicted charging time of each of the one or more battery-powered work machines. The processor 115 may be configured to determine the disruption score, identify one or more charging opportunities, determine the opportunity charge threshold, determine the charge event overhead, and/or a combination thereof, among other examples, in accordance with the charger load. For example, if the processor 115 determines that an idle period for a first battery-powered work machine is a sufficient length of time for charging, but the charger load indicates that a second battery-powered work machine will be using the charger during that idle period, the processor 115 may determine that the idle period for the first battery-powered work machine is not a charging opportunity.

The processor 115 may be configured to control the user interface 105 to display a recommendation associated with replacing the diesel-powered work machine with the battery-powered work machine. The recommendation may be based, at least in part, on the disruption score, the charger load, and/or a combination thereof, among other examples. The processor 115 may determine the recommendation by querying a lookup table 140 stored in the memory 110. For example, the processor 115 may determine the recommendation by querying the lookup table as a result of the disruption score indicating that replacing the diesel-powered work machine with a battery-powered work machine will not significantly delay completion of a construction project.

The recommendation may include identifying, in the lookup table, the battery-powered work machine that can replace the diesel-powered work machine without increasing the disruption score. If no suitable battery-powered work machines exist (e.g., the workday simulation with the battery-powered work machine is assigned the third disruption score or the fourth disruption score), the recommendation may identify a different battery-powered work machine with a lower disruption score. Alternatively, the recommendation may indicate that multiple battery-powered work machines can be used to replace a single diesel-powered work machine. If the disruption score is negatively affected by the charger load, the recommendation may indicate a schedule change (e.g., a change to when the idle periods and/or working periods for one or more battery-powered work machines occur) to allow multiple battery-powered work machines to use the charger at different times. Alternatively, the recommendation may include a recommendation for increasing a quantity of charging locations at a work site.

As indicated above, FIG. 1 is provided as an example. Other examples may differ from what is described with regard to FIG. 1. The number and arrangement of devices shown in FIG. 1 are provided as an example. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) shown in FIG. 1 may perform one or more functions described as being performed by another set of devices shown in FIG. 1.

Figure 2:
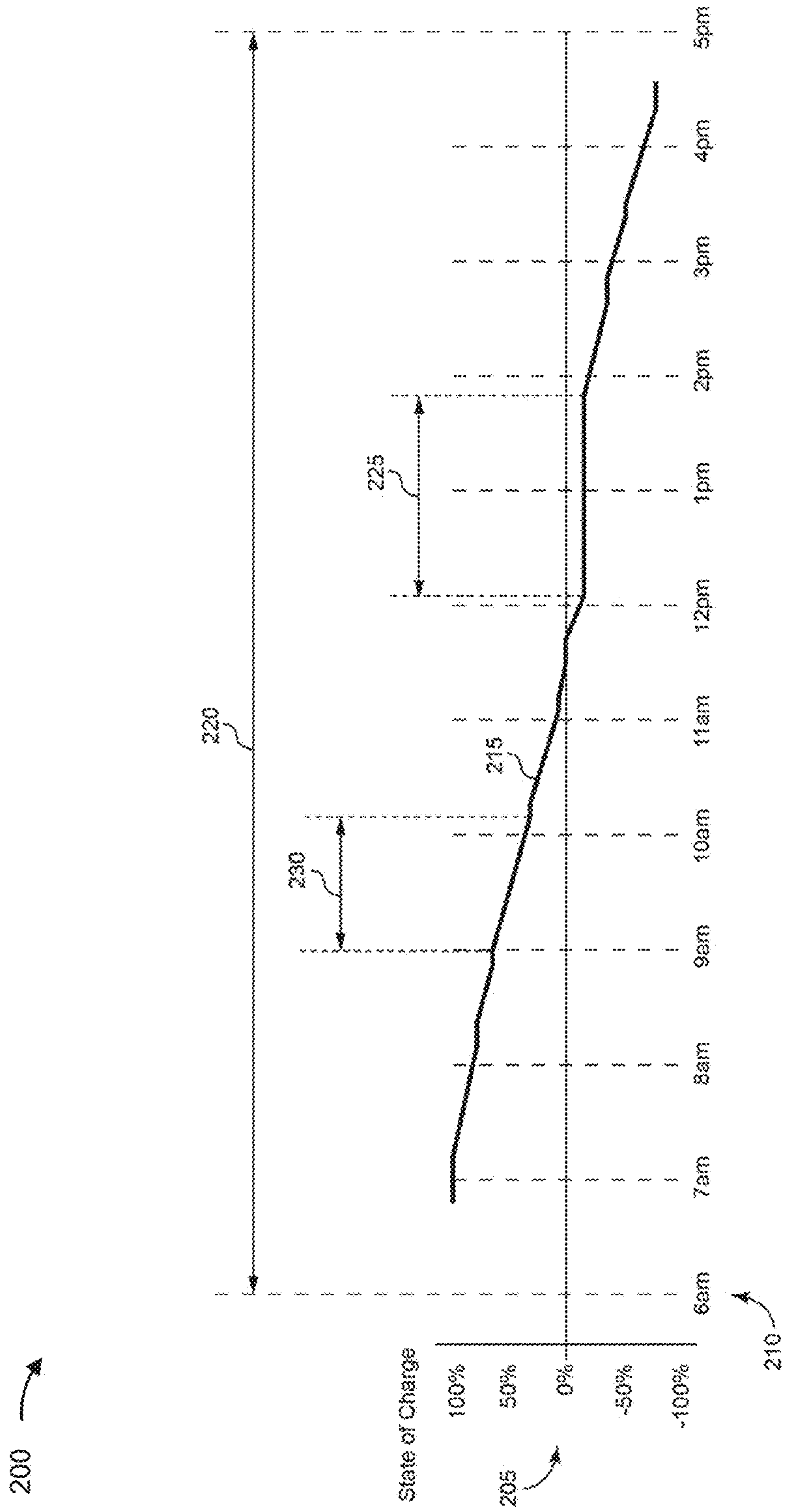
FIGS. 2 and 3 are diagrams of example graphs associated with an estimated utilization of the battery-powered work machine.

FIG. 2 is a diagram of an example graph 200 associated with an estimated utilization of the battery-powered work machine. The example graph 200 includes an X axis 205 and a Y axis 210. The X axis may represent time and the Y axis may represent a battery SoC. The example graph 200 shows how the SoC of the battery of the battery-powered work machine may change over time in accordance with a workday simulation. Accordingly, the example graph 200 illustrates an example battery discharge profile 215 over a workday 220 in accordance with a workday simulation.

The workday includes idle periods 225 and working periods 230. During the idle periods 225, the battery-powered machine is not in use. In some idle periods 225, the battery-powered work machine may be turned off. In some idle periods 225, the battery-powered work machine may be idling (e.g., running but not performing work). During the working periods 230, the battery-powered machine is in use. As shown in the example graph 200, the battery discharge profile 215 may be based, at least in part, on the battery discharge rate, discussed above with respect to FIG. 1, and the occurrences of idle periods 225 and/or working periods 230 in the workday. The battery discharge rate during idle periods 225 may be different from the battery discharge rate during working periods 230. For example, the battery discharge rate may be greater during working periods 230 than during idle periods 225.

In the example graph 200, without charging, the battery discharge profile 215 indicates that the battery-powered work machine will consume more power than available by the battery. For example, as shown in the example graph 200, the battery SoC will reach 0% shortly before 12 pm on the workday. Further, as shown in the example graph 200, the battery-powered work machine is estimated to finish the workday with an SoC between −50% and −100%. Because the SoC cannot be a negative number in a real battery (e.g., a battery in a real-world battery-powered machine), the example graph 200 indicates that the battery-powered work machine will need to be charged during the workday. Alternatively, the example graph 200 may indicate that the battery-powered work machine is not a suitable replacement for a diesel-powered work machine, particularly if the battery-powered work machine cannot be sufficiently charged throughout the workday.

If the computing device 100 determines that the battery-powered work machine is not a suitable replacement for the diesel-powered work machine, the computing device 100 may assign, to the workday simulation, a disruption score (e.g., the third disruption score or the fourth disruption score, discussed above) that indicates that the battery-powered work machine would be highly disruptive to the construction project. If the computing device 100 determines that the battery-powered work machine might be a suitable replacement for the diesel-powered work machine, the computing device 100 may assign, to the workday simulation, a disruption score (e.g., the first disruption score or the second disruption score, discussed above) that indicates that the battery-powered work machine would not be highly disruptive to the construction project.

As indicated above, FIG. 2 is provided as an example. Other examples may differ from what is described with regard to FIG. 2.

Figure 3:
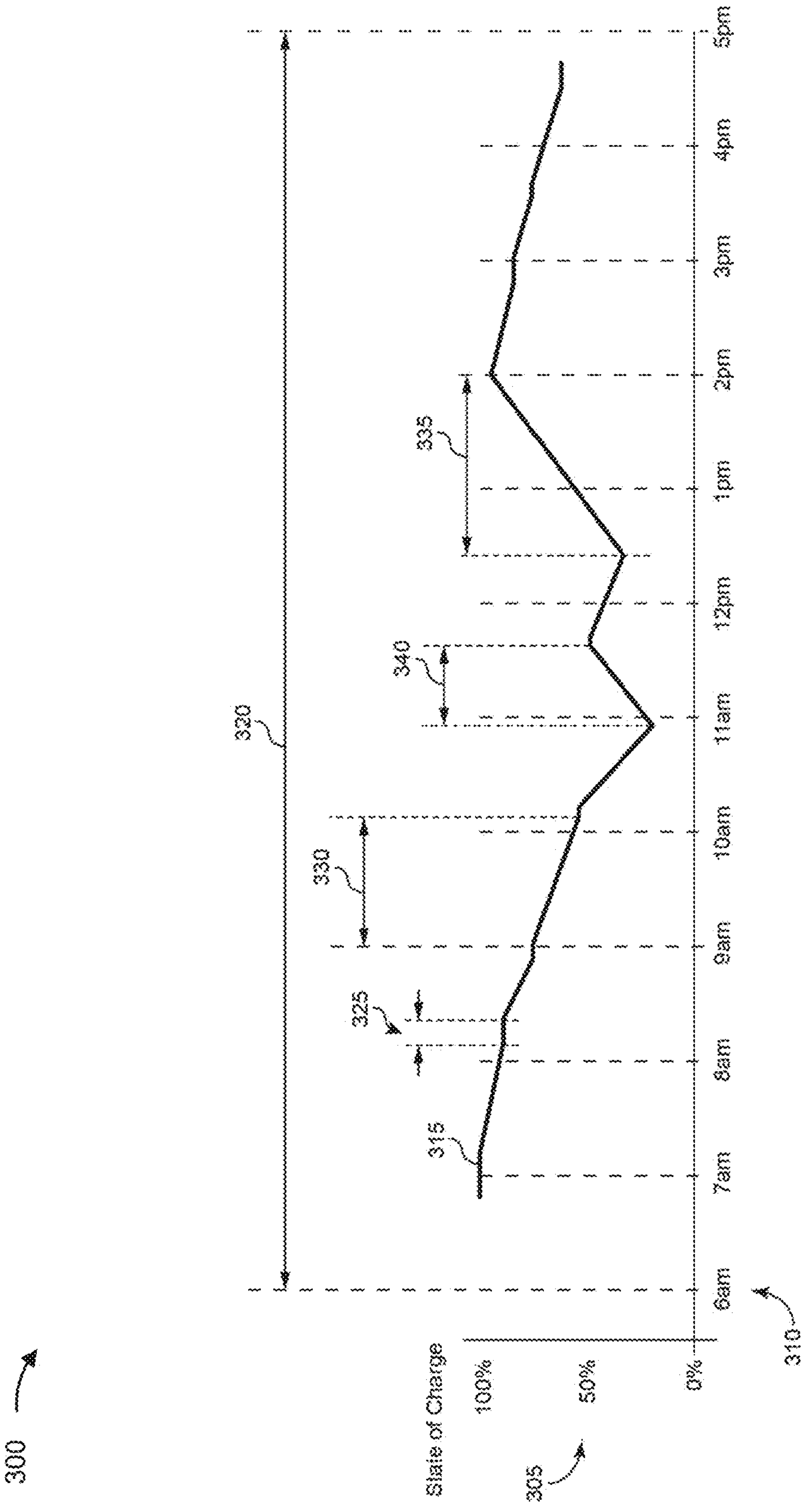

FIG. 3 is a diagram of an example graph 300 associated with an estimated utilization of the battery-powered work machine. The example graph 300 includes an X axis 305 and a Y axis 310. The X axis may represent time and the Y axis may represent a battery SoC. Like the example graph 200 of FIG. 2 discussed above, the example graph 300 shows how the SoC of the battery of the battery-powered work machine may change over time in accordance with a workday simulation. Additionally, the example graph 300 shows how the SoC of the battery of the battery-powered work machine may change as a result of accounting for idle periods 325 with opportunities to charge the battery. Accordingly, the example graph 300 illustrates an example battery discharge profile 315 over a workday in accordance with a workday simulation.

The workday of the example graph 300 of FIG. 3 includes idle periods 325 and working periods 330. During the idle periods 325, the battery-powered machine is not in use. During the working periods 330, the battery-powered machine is in use. In the example graph 300 of FIG. 3, one or more of the idle periods 325 may be long enough for the battery of the battery-powered work machine to be charged. For example, in the workday of the example graph 300 of FIG. 3, an idle period may occur from 12:30 pm until 2 pm, which may be long enough for the computing device 100 to identify a charging opportunity 335 if, for example, 90 minutes is greater than the charging opportunity threshold.

As shown in the example graph 300, the battery discharge profile may be based, at least in part, on the battery discharge rate, discussed above with respect to FIG. 1, and the occurrences of idle periods 325 and/or working periods 330 in the workday. The battery discharge rate during idle periods 325 may be different from the battery discharge rate during working periods 330. For example, the battery discharge rate may be greater during working periods 330 than during idle periods 325.

In the example graph 300, the battery discharge profile indicates that the SoC of the battery will fall below the first threshold at 11 am on the workday. The computing device 100 may identify a force charge period 340, which may be a period of time in which the battery of the battery-powered work machine must be charged to a SoC equal to or greater than the second threshold. In the example graph 300 of FIG. 3, the second threshold may be based on a time at which the charging opportunity 335 will occur.

Accordingly, the example graph 300 of FIG. 3 shows that using a battery-powered work machine will require two hours of charging time (e.g., a 30-minute force charge period 340 and a 90-minute charging period during the idle period identified as a charging opportunity 335). Therefore, replacing a diesel-powered work machine with the battery-powered work machine may result in an extra 30 minutes of downtime since only the force charge period 340 interrupted a working period whereas the 90-minute charging period occurs during an idle period. The disruption score for the workday simulation represented in the example graph 300 may reflect a moderate level of disruption. Accordingly, the computing device 100 may assign, for example, the second disruption score to the workday simulation.

As indicated above, FIG. 3 is provided as an example. Other examples may differ from what is described with regard to FIG. 3.

Figure 4:
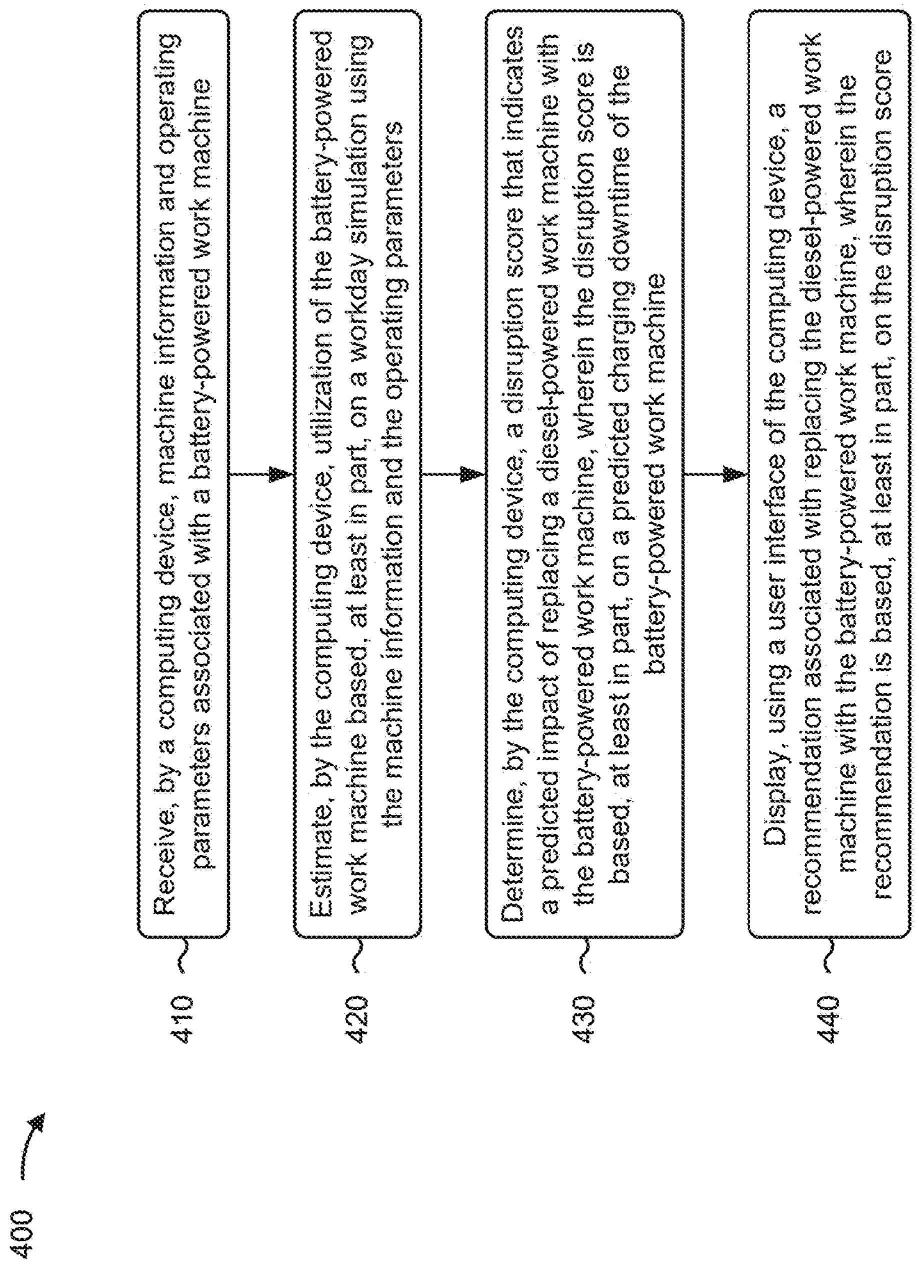
FIG. 4 is a flowchart of an example process associated with battery-powered work machine downtime analysis.

FIG. 4 is a flowchart of an example process 400 associated with battery-powered work machine downtime analysis. One or more process blocks of FIG. 4 may be performed by a computing device (e.g., computing device 100). Additionally, or alternatively, one or more process blocks of FIG. 4 may be performed by another device or a group of devices separate from or including the computing device, such as another device or component that is internal or external to the computing device.

As shown in FIG. 4, process 400 may include receiving machine information and operating parameters associated with a battery-powered work machine (block 410). For example, the computing device may receive machine information and operating parameters associated with a battery-powered work machine, as described above. The operating parameters may include one or more of a battery capacity, a battery health, charger information, a charge threshold, a utilization metric, or a specific fuel consumption ratio. The machine information may include one or more of a ground speed, a fuel rate, or position information.

As further shown in FIG. 4, process 400 may include estimating utilization of the battery-powered work machine based, at least in part, on a workday simulation using the machine information and the operating parameters (block 420). For example, the computing device may estimate utilization of the battery-powered work machine based, at least in part, on a workday simulation using the machine information and the operating parameters, as described above. Estimating the utilization of the battery-powered work machine may include determining a battery discharge rate having at least a first battery state of charge and a second battery state of charge, comparing the first battery state of charge to a first threshold, and comparing the second battery state of charge to a second threshold. Estimating the utilization of the battery-powered work machine may include estimating a work period in accordance with a battery discharge rate. Estimating the utilization of the battery-powered work machine may include identifying one or more charging opportunities, and determining a battery discharge rate in accordance with the one or more charging opportunities. Identifying the one or more charging opportunities may include estimating a length of an idle period, comparing the length of the idle period to an opportunity charge threshold, and identifying the one or more charging opportunities as a result of the length of the idle period being greater than the opportunity charge threshold.

As further shown in FIG. 4, process 400 may include determining a disruption score that indicates a predicted impact of replacing a diesel-powered work machine with the battery-powered work machine, wherein the disruption score is based, at least in part, on a predicted charging downtime of the battery-powered work machine (block 430). For example, the computing device may determine a disruption score that indicates a predicted impact of replacing a diesel-powered work machine with the battery-powered work machine, wherein the disruption score is based, at least in part, on a predicted charging downtime of the battery-powered work machine, as described above. In some implementations, the disruption score is based, at least in part, on a predicted charging downtime of the battery-powered work machine. Determining the disruption score may include estimating a driving time overhead in accordance with a machine speed and a charger distance, and determining the disruption score in accordance with the driving time overhead. Determining the disruption score may include estimating an energy usage overhead in accordance with a driving time and an average power consumption, and determining the disruption score in accordance with the energy usage overhead. Determining the disruption score may include estimating a charge event overhead in accordance with an amount of time associated with initiating and ending charging of the battery-powered work machine, and determining the disruption score in accordance with the charge event overhead.

As further shown in FIG. 4, process 400 may include displaying, using a user interface of the computing device, a recommendation associated with replacing the diesel-powered work machine with the battery-powered work machine, wherein the recommendation is based, at least in part, on the disruption score (block 440). For example, the computing device may display, using a user interface of the computing device, a recommendation associated with replacing the diesel-powered work machine with the battery-powered work machine, wherein the recommendation is based, at least in part, on the disruption score, as described above.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

INDUSTRIAL APPLICABILITY

The computing device described herein may be used to analyze a workday for a construction project. Using a workday simulation, the computing device may indicate how replacing diesel-powered work machine with a battery-powered work machine will affect the workday. By assigning a disruption score to a workday simulation, the computing device may provide one or more recommendations that an operator can use to reduce downtime and/or minimize negative impacts of replacing one or more diesel-powered work machines with one or more battery-powered work machines. The computing device may determine the disruption score based on a utilization of the one or more battery-powered work machines. The utilization may be estimated using a workday simulation that accounts for machine information and operating parameters associated with each battery-powered work machine used at the construction site on the workday being analyzed.

Because the workday simulation models real-world scenarios, the computing device can provide an accurate representation of how a workday at a construction site will be affected by replacing one or more diesel-powered work machines with one or more battery-powered work machines. Further, by providing recommendations, the computing device may help a construction site manager schedule a construction project that minimizes downtime and timely complete the construction project.

The foregoing disclosure provides illustration and description, but is not intended to be exhaustive or to limit the implementations to the precise forms disclosed. Modifications and variations may be made in light of the above disclosure or may be acquired from practice of the implementations. Furthermore, any of the implementations described herein may be combined unless the foregoing disclosure expressly provides a reason that one or more implementations cannot be combined. Even though particular combinations of features are recited in the claims and/or disclosed in the specification, these combinations are not intended to limit the disclosure of various implementations. Although each dependent claim listed below may directly depend on only one claim, the disclosure of various implementations includes each dependent claim in combination with every other claim in the claim set.

When "a processor" or "one or more processors" (or another device or component, such as "a controller" or "one or more controllers") is described or claimed (within a single claim or across multiple claims) as performing multiple operations or being configured to perform multiple operations, this language is intended to broadly cover a variety of processor architectures and environments. For example, unless explicitly claimed otherwise (e.g., via the use of "first processor" and "second processor" or other language that differentiates processors in the claims), this language is intended to cover a single processor performing or being configured to perform all of the operations, a group of processors collectively performing or being configured to perform all of the operations, a first processor performing or being configured to perform a first operation and a second processor performing or being configured to perform a second operation, or any combination of processors performing or being configured to perform the operations. For example, when a claim has the form "one or more processors configured to: perform X; perform Y; and perform Z," that claim should be interpreted to mean "one or more processors configured to perform X; one or more (possibly different) processors configured to perform Y; and one or more (also possibly different) processors configured to perform Z."

As used herein, "a," "an," and a "set" are intended to include one or more items, and may be used interchangeably with "one or more." Further, as used herein, the article "the" is intended to include one or more items referenced in connection with the article "the" and may be used interchangeably with "the one or more." Further, the phrase "based on" is intended to mean "based, at least in part, on" unless explicitly stated otherwise. Also, as used herein, the term "or" is intended to be inclusive when used in a series and may be used interchangeably with "and/or," unless explicitly stated otherwise (e.g., if used in combination with "either" or "only one of").

What is claimed is:

1. A method, comprising:

receiving, by a computing device, machine information and operating parameters associated with a battery-powered work machine;

estimating, by the computing device, utilization of the battery-powered work machine based, at least in part, on a workday simulation that includes one or more idle periods and one or more working periods over a workday using the machine information and the operating parameters;

determining, by the computing device, a disruption score that indicates a predicted impact of replacing a diesel-powered work machine with the battery-powered work machine, wherein the disruption score is based, at least in part, on a predicted charging downtime of the battery-powered work machine associated with at least one of the one or more idle periods or the one or more working periods; and displaying, using a user interface of the computing device, a recommendation associated with replacing the diesel-powered work machine with the battery-powered work machine, wherein the recommendation is based, at least in part, on the disruption score, and wherein a user replaces the diesel-powered work machine with the battery-powered work machine according to the recommendation.

2. The method of claim 1, wherein estimating the utilization of the battery-powered work machine includes:

determining a battery discharge rate having at least a first battery state of charge and a second battery state of charge;

comparing the first battery state of charge to a first threshold; and comparing the second battery state of charge to a second threshold.

3. The method of claim 1, wherein estimating the utilization of the battery-powered work machine includes estimating a work period in accordance with a battery discharge rate.

4. The method of claim 1, wherein estimating the utilization of the battery-powered work machine includes:

identifying one or more charging opportunities; and determining a battery discharge rate in accordance with the one or more charging opportunities.

5. The method of claim 4, wherein identifying the one or more charging opportunities includes:

estimating a length of an idle period;

comparing the length of the idle period to an opportunity charge threshold; and identifying the one or more charging opportunities as a result of the length of the idle period being greater than the opportunity charge threshold.

6. The method of claim 1, wherein determining the disruption score includes:

estimating a driving time overhead in accordance with a machine speed and a charger distance; and determining the disruption score in accordance with the driving time overhead.

7. The method of claim 1, wherein determining the disruption score includes:

estimating an energy usage overhead in accordance with a driving time and an average power consumption; and determining the disruption score in accordance with the energy usage overhead.

8. The method of claim 1, wherein determining the disruption score includes:

estimating a charge event overhead in accordance with an amount of time associated with initiating and ending charging of the battery-powered work machine; and determining the disruption score in accordance with the charge event overhead.

9. The method of claim 1, wherein the operating parameters include one or more of a battery capacity, a battery health, charger information, a charge threshold, a utilization metric, or a specific fuel consumption ratio.

10. The method of claim 1, wherein the machine information includes one or more of a ground speed, a fuel rate, or position information.

11. A computing device, comprising:

a user interface having a display screen;

one or more memories; and one or more processors, communicatively coupled to the one or more memories, configured to:

receive machine information and operating parameters associated with a battery-powered work machine;

estimate utilization of the battery-powered work machine based, at least in part, on a workday simulation using the machine information and the operating parameters;

determine a disruption score indicating a predicted impact of replacing a diesel-powered work machine with the battery-powered work machine, wherein the disruption score is based, at least in part, on a predicted charging downtime of the battery-powered work machine;

output, to the display screen, a recommendation associated with replacing the diesel-powered work machine with the battery-powered work machine, wherein the recommendation is based, at least in part, on the disruption score;

when the diesel-powered work machine is replaced with the battery-powered work machine according to the recommendation, receive updated machine information and updated operating parameters associated with the battery-powered work machine; and estimate an actual utilization of the battery-powered work machine based, at least in part, on the updated machine information and the updated operating parameters.

12. The computing device of claim 11, wherein the one or more processors are configured to estimate the utilization of the battery-powered work machine by:

determining a battery discharge rate having at least a first battery state of charge and a second battery state of charge;

comparing the first battery state of charge to a first threshold; and comparing the second battery state of charge to a second threshold.

13. The computing device of claim 11, wherein the one or more processors are configured to estimate the utilization of the battery-powered work machine by estimating a work period in accordance with a battery discharge rate.

14. The computing device of claim 11, wherein the one or more processors are configured to estimate the utilization of the battery-powered work machine by:

identifying one or more charging opportunities; and determining a battery discharge rate in accordance with the one or more charging opportunities, wherein the one or more processors are configured to identify the one or more charging opportunities by:

estimating a length of an idle period;

comparing the length of the idle period to an opportunity charge threshold; and identifying the one or more charging opportunities as a result of the length of the idle period being greater than the opportunity charge threshold.

15. The computing device of claim 11, wherein the one or more processors are configured to determine the disruption score by:

estimating a driving time overhead in accordance with a machine speed and a charger distance; and determining the disruption score in accordance with the driving time overhead.

16. The computing device of claim 11, wherein the one or more processors are configured to determine the disruption score by:

estimating an energy usage overhead in accordance with a driving time and an average power consumption; and determining the disruption score in accordance with the energy usage overhead.

17. The computing device of claim 11, wherein the one or more processors are configured to determine the disruption score by:

estimating a charge event overhead in accordance with an amount of time associated with initiating and ending charging of the battery-powered work machine; and determining the disruption score in accordance with the charge event overhead.

18. The computing device of claim 11, wherein the operating parameters include one or more of a battery capacity, a battery health, charger information, a charge threshold, a utilization metric, or a specific fuel consumption ratio.

19. The computing device of claim 11, wherein the machine information includes one or more of a ground speed, a fuel rate, or position information.

20. A computing device, comprising:

a user interface having a display screen;

one or more memories; and one or more processors, communicatively coupled to the one or more memories, configured to:

receive machine information and operating parameters associated with one or more battery-powered work machines;

estimate utilization of the one or more battery-powered work machines based, at least in part, on a workday simulation that includes one or more idle periods and one or more working periods over a workday using the machine information and the operating parameters;

determine a charger load based, at least in part, on the workday simulation and utilization of the one or more battery-powered work machines, wherein the charger load is based, at least in part, on a predicted charging time of each of the one or more battery-powered work machines; and output, to the display screen, a recommendation associated with the one or more battery-powered work machines, wherein the recommendation is based, at least in part, on the charger load, and wherein a user replaces a diesel-powered work machine with the battery-powered work machine according to the recommendation.

* * * * *